(12) United States Patent
Nishibayashi et al.

(10) Patent No.: US 7,147,918 B2
(45) Date of Patent: Dec. 12, 2006

(54) MICROFABRICATED DIAMOND ELEMENT AND METHOD OF FABRICATING MICROFABRICATED DIAMOND ELEMENT

(75) Inventors: Yoshiki Nishibayashi, Itami (JP); Yutaka Ando, Sagamihara (JP); Takahiro Imai, Itami (JP)

(73) Assignees: Sumitomo Electric Industries, Ltd., Osaka (JP); Japan Fine Ceramics Center, Aichi (JP)

( * ) Notice: Subject to any disclaimer, the term of this patent is extended or adjusted under 35 U.S.C. 154(b) by 414 days.

(21) Appl. No.: 10/661,591

(22) Filed: Sep. 15, 2003

(65) Prior Publication Data

US 2004/0058539 A1    Mar. 25, 2004

(30) Foreign Application Priority Data

Sep. 20, 2002    (JP)    ............................ P2002-276425

(51) Int. Cl.
*H01L 33/00*    (2006.01)
(52) U.S. Cl. ..................................... 428/408
(58) Field of Classification Search ................. 428/408
See application file for complete search history.

(56) References Cited

FOREIGN PATENT DOCUMENTS

JP    P2002-75171 A    3/2002

OTHER PUBLICATIONS

Extended Abstracts (The 47th Spring Meeting); The Japan Society of Applied Physics and Related Societies, No. 1 30a-YQ-3 (p. 377).
Extended Abstracts (The 46th Spring Meeting); The Japan Society of Applied Physics and Related Societies, No. 1 30p-M-12 (p. 415).
Extended Abstracts (The 62nd Autumn Meeting); The Japan Society of Applied Physics and Related Societies, No. 3 13a-ZK-5 (p. 782).

*Primary Examiner*—Archene Turner
(74) *Attorney, Agent, or Firm*—McDermott Will & Emery LLP

(57) ABSTRACT

A diamond electron emission element is provided with a substrate, and a plurality of quadrangular columns (microscopic projections) composed of diamond and with side faces of flat faces, which are arranged at equal intervals on the substrate. A top end face (horizontal section) is of a quadrangular shape having a length of long sides being a [nm] and a length of short sides being ka [nm], and a thin film of $SiO_2$ is formed on a side face on the short-edge side. The length a [nm] of long sides and the length ka [nm] of short sides satisfy relational expressions of Formulae (1) and (2) below.

$$C_1 = 2a\sqrt{1+k^2} \quad (1)$$

(2)    $n\lambda = C_1$ $C_1$: a distance [nm] of a lap in a situation where light generated inside each quadrangular column goes around on a specific circuit while being reflected on the side faces of the quadrangular column,
n: an arbitrary positive integer, and
λ: an emission peak wavelength λ [nm] of the diamond making the quadrangular columns.

15 Claims, 18 Drawing Sheets

MICROFABRICATED DIAMOND ELEMENT AND METHOD OF FABRICATING MICROFABRICATED DIAMOND ELEMENT

BACKGROUND OF THE INVENTION

1. Field of the Invention

The present invention relates to microfabricated diamond elements used in light emitting devices and others, and methods of fabricating microfabricated diamond elements.

2. Related Background Art

The microfabricated diamond elements used in the conventional light emitting devices was those with PN junctions in diamond columns of arbitrary shape, for example, as described in New Diamond (Japan New diamond Forum) Vol. 17, No. 4 (2001), p10 and subsequent pages (Document 2).

Other documents listed below also disclose the techniques related to the present invention.

[Document 1] Japanese Patent Application Laid-Open No. 2002-075171

[Document 2] New Diamond (Japan New Diamond Forum) Vol. 17 No. 4 (2001) p10 and subsequent pages

[Document 3] Extended Abstracts (The 47th Spring Meeting); The Japan Society of Applied Physics and Related Societies, No. 1 30a-YQ-3 (p377)

[Document 4] Extended Abstracts (The 46th Spring Meeting); The Japan Society of Applied Physics and Related Societies, No. 1 30p-M-12 (p415)

[Document 5] Extended Abstracts (The 62nd Autumn Meeting); The Japan Society of Applied Physics and Related Societies, No. 3 13a-ZK-5 (p782)

SUMMARY OF THE INVENTION

However, the luminous efficiencies were insufficient with the microfabricated diamond elements used in the conventional light emitting devices.

The present invention has been accomplished in view of the above problem and an object of the invention is to provide a microfabricated diamond element of shape capable of increasing the luminous efficiency.

In order to solve the above problem, a microfabricated diamond element according to the present invention is a microfabricated diamond element wherein at least one columnar body of a quadrangular cross section comprising diamond is formed on a substrate, and wherein lengths of a long side and a short side in the cross section of the columnar body satisfy relational expressions represented by Formulae (1) and (2) below;

$$C_1 = 2a\sqrt{1+k^2} \tag{1}$$

$$n\lambda \approx C_1 \tag{2}$$

$C_1$: a distance [nm] of a lap in a situation where light generated inside the columnar body goes around on a specific circuit while being reflected on side faces of the columnar body, n: an arbitrary positive integer, $\lambda$: an emission peak wavelength [nm] of the diamond, a: the length of the long side [nm], and k: a ratio of the length of the short side to the length of the long side.

In order to solve the above problem, another microfabricated diamond element according to the present invention is a microfabricated diamond element wherein at least one columnar body of a substantially regularly hexagonal cross section comprising diamond is formed on a substrate, and wherein lengths of sides in the cross section of the columnar body satisfy relational expressions represented by Formulae (3) and (4) below;

$$C_2 = 3\sqrt{3}b \tag{3}$$

$$n\lambda \approx C_2 \tag{4}$$

$C_2$: a distance [nm] of a lap in a situation where light generated inside the columnar body goes around on a specific circuit while being reflected on side faces of the columnar body, n: an arbitrary positive integer, $\lambda$: an emission peak wavelength [nm] of the diamond, and b: the length of the sides [nm].

In order to solve the above problem, still another microfabricated diamond element according to the present invention is a microfabricated diamond element wherein at least one columnar body of a circular cross section comprising diamond is formed on a substrate, and wherein when a length of a radius in the cross section of the columnar body is r [nm], and a specific circuit, on which light generated inside the columnar body goes around while being reflected on a side face of the columnar body, is represented by a regular polygon in which a distance from a center to corners thereof is r [nm], the perimeter $C_3$ [m] of the regular polygon satisfies relational expressions represented by Formulae (5) and (6) below:

$$3\sqrt{3}r < C_3 < 2\pi r \tag{5}$$

$$n\lambda \approx C_3 \tag{6}$$

n: an arbitrary positive integer, and $\lambda$: an emission peak wavelength [nm] of the diamond.

Part of the light generated inside the columnar body goes around the interior of the columnar body while being reflected on the side faces or side face of the columnar body. When the above relational expressions are satisfied, the distance of one lap around the circuit becomes approximately equal to an integral multiple of the emission peak wavelength (definition of the "emission peak wavelength" is described latter in the explanation of the embodiment) of the diamond. For this reason, the light of the emission peak wavelength (light traveling normally to the longitudinal direction of the columnar body and light including a small traveling component in the longitudinal direction of the columnar body) resonates inside the columnar body and is extracted to the outside without being attenuated. As a consequence, the luminous efficiency is increased.

The microfabricated diamond element of the present invention is preferably one wherein each side face of the columnar body is a flat surface consisting of a diamond crystal face.

The microfabricated diamond element of the present invention is also preferably one wherein the diamond crystal face is a (100) face.

When the side faces are fairly flat surfaces consisting of diamond crystal faces, the light is regularly reflected on the side faces. For this reason, the light generated inside the columnar body tends to become a standing wave. When the diamond crystal faces are (100) faces, the flat surfaces are formed with best flatness.

The microfabricated diamond element of the present invention is preferably one wherein a width $w_1$ of the columnar body is expressed by Formula (7) below;

$$w_1 = a\sqrt{1+k^2}, \tag{7}$$

and wherein the width $w_1$ is not more than 500 nm.

The microfabricated diamond element of the present invention is also preferably one wherein a width $w_2$ of the columnar body is expressed by Formula (8) below;

$$w_2 = 2b, \qquad (8)$$

and wherein the width $w_2$ is not more than 500 nm.

The microfabricated diamond element of the present invention is also preferably one wherein a diameter of the columnar body is not more than 500 nm.

When the width (diameter) of the columnar body is not more than 500 nm, confinement of carriers (electrons or holes) becomes sufficient, to increase the probability of recombination so as to promote emission of light. Table 1 presents the relationship between widths (sizes) of the columnar body and intensities of cathodeluminescence.

TABLE 1

| SIZE | 2 μm | 1 μm | 700 nm | 500 nm | 300 nm | SUBSTRATE |
|---|---|---|---|---|---|---|
| INTENSITY | 2 | 3 | 5 | 10 | 20 | 1 |

Note) intensities are given as relative intensities to that of the substrate being 1.

The microfabricated diamond element of the present invention is preferably one wherein a width $w_1$ of the columnar body is expressed by Formula (7) below;

$$w_1 = a\sqrt{1+k^2}, \qquad (7)$$

and wherein a ratio of a height to the width $w_1$ of the columnar body is not less than 2.

The microfabricated diamond element of the present invention is also preferably one wherein a width $w_2$ of the columnar body is expressed by Formula (8) below;

$$w_2 = 2b, \qquad (8)$$

and wherein a ratio of a height to the width $w_2$ of the columnar body is not less than 2.

The microfabricated diamond element of the present invention is also preferably one wherein a ratio of a height of the columnar body to a diameter of the columnar body is not less than 2.

When the aspect ratio (the aspect ratio is defined as a ratio of the height to the width or diameter of the columnar body) is not less than 2, carriers (electrons or holes) become unlikely to migrate away to the substrate side, so as to increase the probability of recombination to facilitate emission of light. Table 2 provides the relationship between aspect ratios and intensities of cathodeluminescence.

TABLE 2

| ASPECT RATIO | 0.5 | 1 | 1.4 | 2 | 3 | SUBSTRATE |
|---|---|---|---|---|---|---|
| INTENSITY | 2 | 3 | 5 | 10 | 20 | 1 |

Note) intensities are given as relative intensities to that of the substrate being 1.

The microfabricated diamond element of the present invention is preferably one wherein a ratio of an area of the cross section normal to the longitudinal direction of the columnar body to an overall exposed area of the columnar body is not more than 1/10.

When the ratio of the sectional area of the cross section normal to the longitudinal direction of the columnar body to the overall exposed area of the columnar body is not more than 1/10, carriers (electrons or holes) become unlikely to migrate away to the substrate side, so as to increase the probability of recombination to facilitate emission of light. Table 3 provides the relationship between area ratios and intensities of cathodeluminescence.

TABLE 3

| AREA RATIO | 1/3 | 1/6 | 1/7.6 | 1/10 | 1/14 | SUBSTRATE |
|---|---|---|---|---|---|---|
| INTENSITY | 2 | 3 | 5 | 10 | 20 | 1 |

Note) intensities are given as relative intensities to that of the substrate being 1.

The microfabricated diamond element of the present invention is preferably one wherein the columnar bodies are arranged at equal intervals.

The above configuration facilitates fabrication of devices to which the microfabricated diamond element is applied. Especially, when the columnar bodies are provided with the periodicity matching the wavelength of the light to be extracted, it becomes feasible to apply the microfabricated diamond element for emitting monochromatic light and to laser devices.

The microfabricated diamond element of the present invention is preferably one wherein an optically transparent film with a refractive index smaller than that of the diamond is formed in part of the side face of the columnar body.

The light repeatedly reflected on the side faces or side face of the columnar body is extracted through the optically transparent film to the outside.

A production method of a microfabricated diamond element according to the present invention is a method of fabricating a microfabricated diamond element, comprising: an etching step of placing a metal in contiguity with a diamond substrate in a reaction chamber and then effecting reactive ion etching on the diamond substrate in the reaction chamber.

The method enables formation of finely patterned masks that cannot be made by photolithography.

Another production method of a microfabricated diamond element according to the present invention is preferably a method of fabricating a microfabricated diamond element, comprising: a step of patterning a diamond substrate with microscopic Al dots not more than 500 nm in diameter in an arrayed state; and a step of effecting reactive ion etching on the diamond substrate in a reaction chamber into which a $CF_4/O_2$ gas is introduced at a flow ratio of $CF_4$ not more than 3%.

The arrayed columnar bodies are formed by the above production method. They can also be arrayed at intervals matching the wavelength of the light to be extracted. In this case, by effecting resonance outside, it becomes feasible to apply the element to devices emitting monochromatic light and to laser devices. It is advantageous herein to use a single-crystal substrate or a substrate highly oriented in plane, because orientations of the columnar bodies can be automatically aligned in a post-process.

The production method of the microfabricated diamond element according to the present invention is preferably one wherein the etching step comprises a step of introducing a $CF_4/O_2$ gas at a flow ratio of $CF_4$ not more than 3% as a reactive gas into the reaction chamber.

If the plasma gas contains only oxygen a number of aciculate portions will be formed at the tip of one projection; whereas, the addition of $CF_4$ 1–3% will result in making a single aciculate portion there for each tip of the projection.

The production method of the microfabricated diamond element according to the present invention is preferably one further comprising: a diamond crystal face forming step of exposing the diamond substrate with microscopic projections formed by the etching step, to a plasma of a gas mainly comprised of hydrogen.

The side faces of the columnar body are reconstructed into diamond crystal faces.

In order to solve the above problem, another microfabricated diamond element of the present invention is a microfabricated diamond element wherein at least one columnar body of a quadrangular cross section comprising diamond and having a maximum diameter of not more than 50 nm is formed on a substrate, and wherein lengths of a long side and a short side in the cross section of the columnar body satisfy relational expressions represented by Formulae (9) and (10) below;

$$n\gamma \approx 2a \quad (9)$$

$$m\gamma \approx 2ka \quad (10)$$

n: an arbitrary positive integer,
m: an arbitrary positive integer,
γ: the de Broglie wavelength [nm] of electrons or holes in the diamond,
a: the length of the long side [nm], and
k: a ratio of the length of the short side to the length of the long side.

Since the de Broglie wave of electrons (or holes) traveling in the long-side direction and in the short-side direction forms a standing wave, electrons in the diamond become likely to be excited. The effect becomes prominent when the columnar body confining electrons (holes) has a narrow width not more than the maximum diameter of the cross section of 50 nm. As a consequence, the luminous efficiency is increased.

Figure 4A:
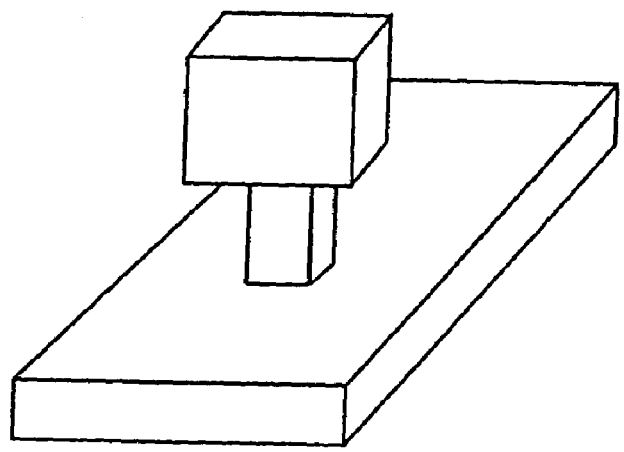
Figure 4B:
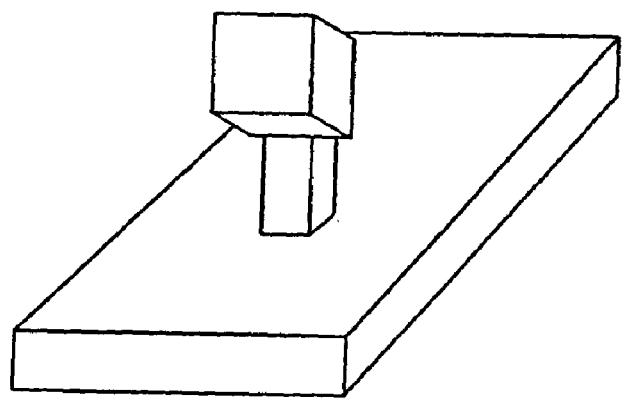
Figure 4C:
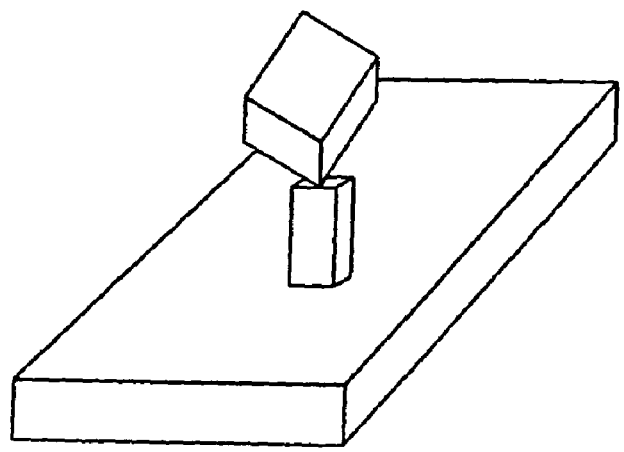
Figure 5A:
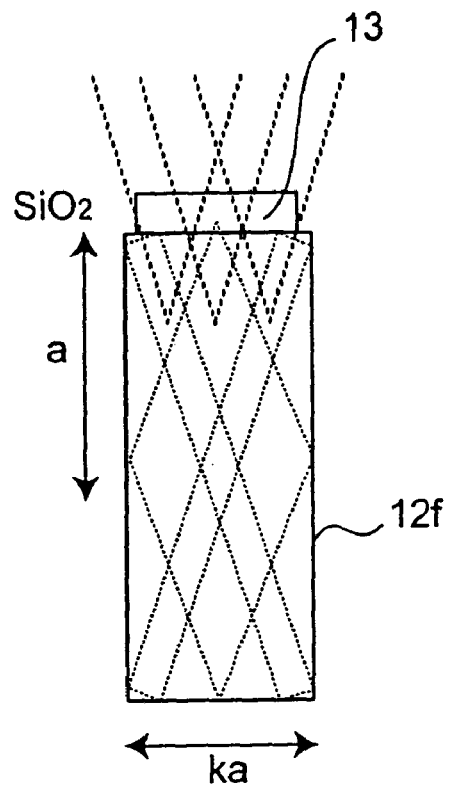
Figure 5B:
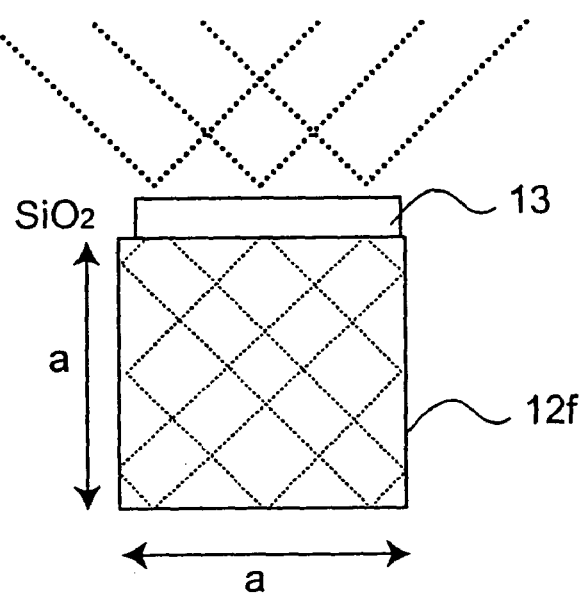
Figure 6:
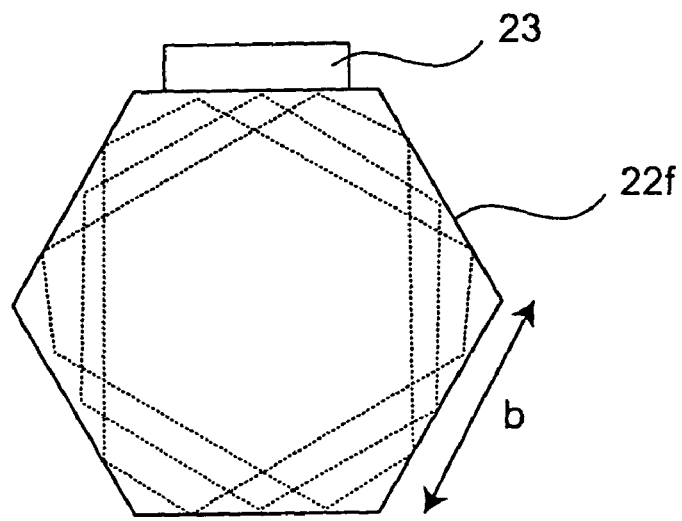
Figure 7A:
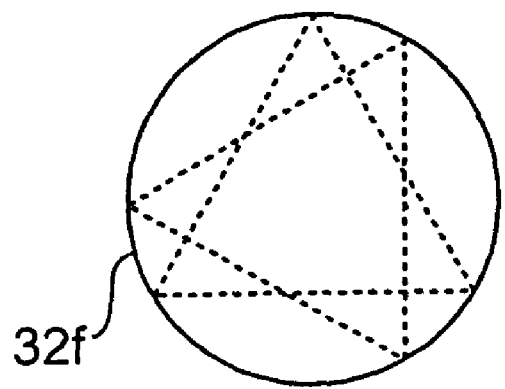
Figure 7B:
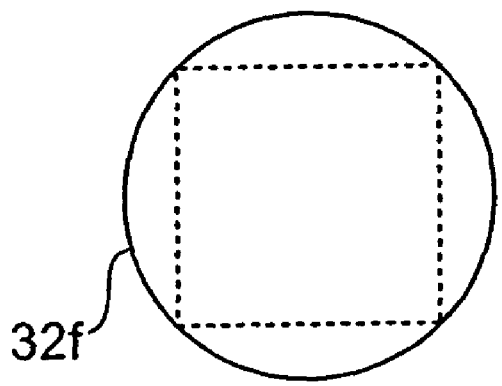
Figure 7C:
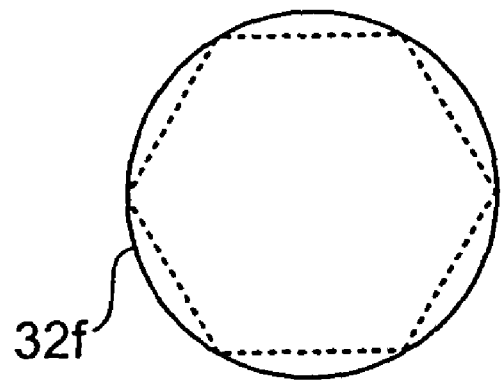
Figure 8:
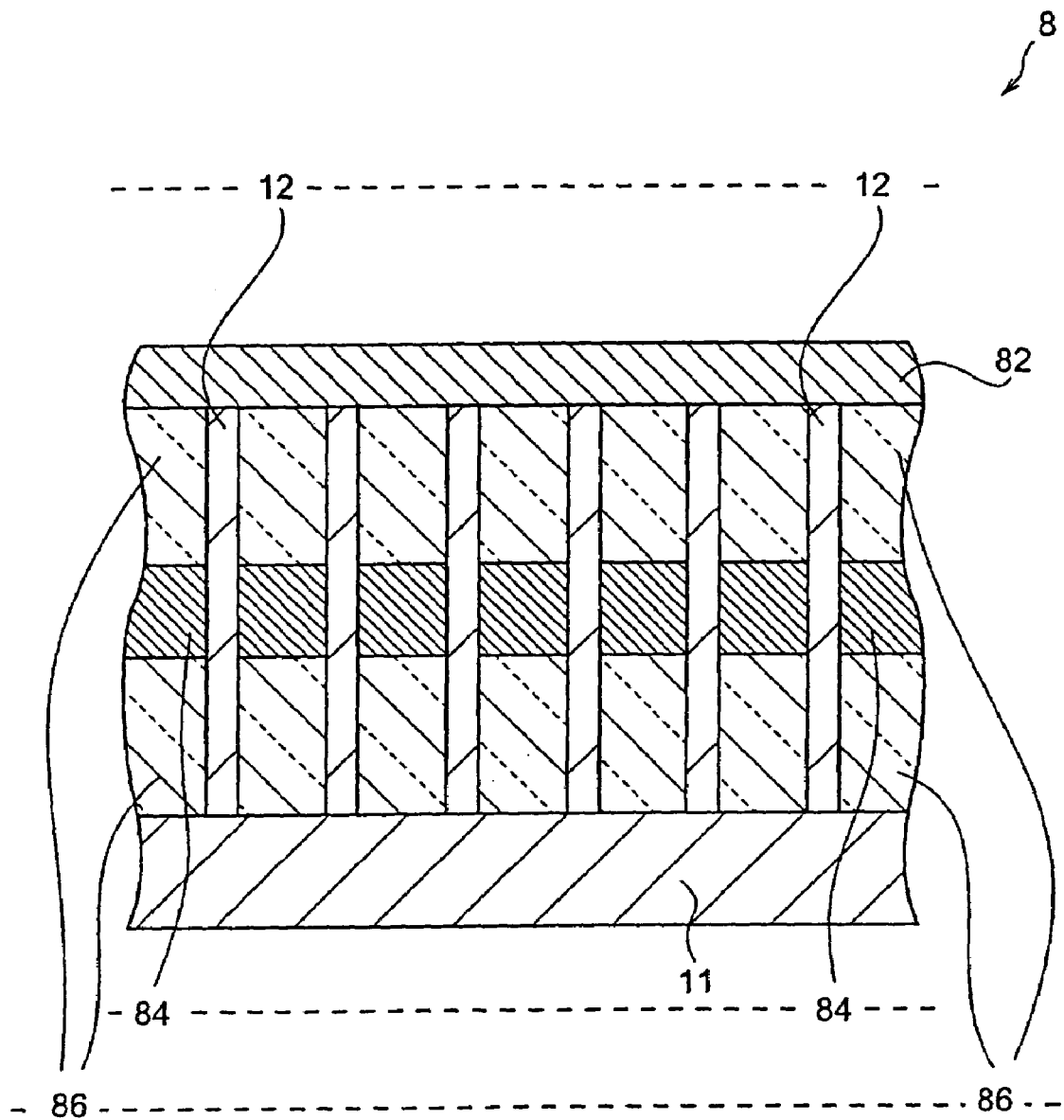
Figure 9:
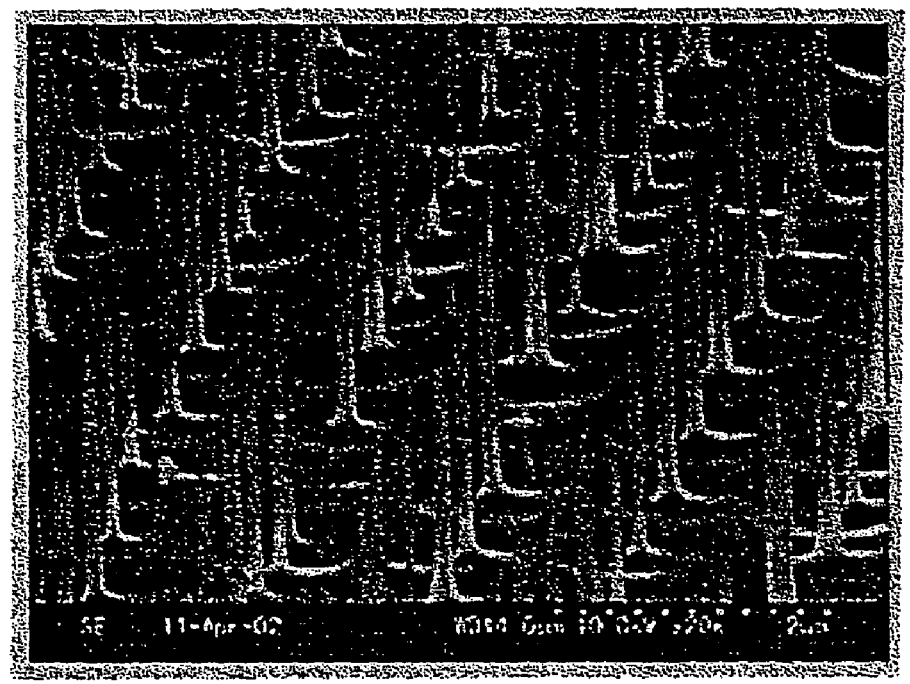
Figure 10A:
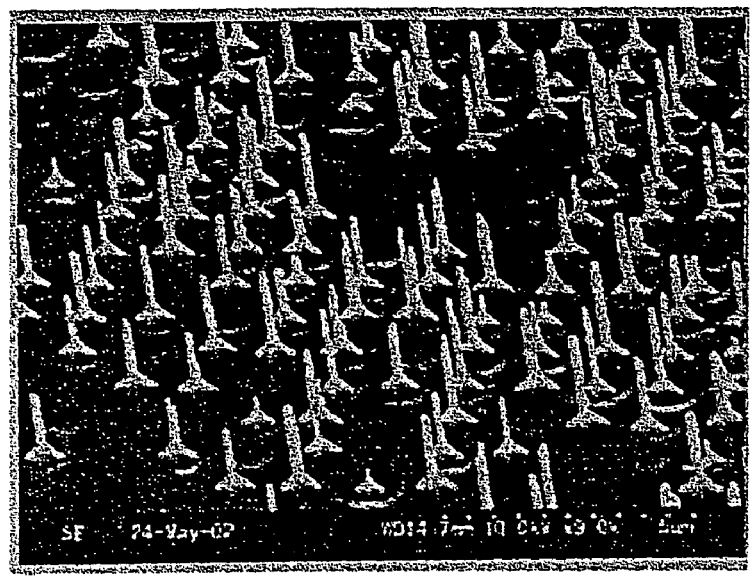
Figure 10B:
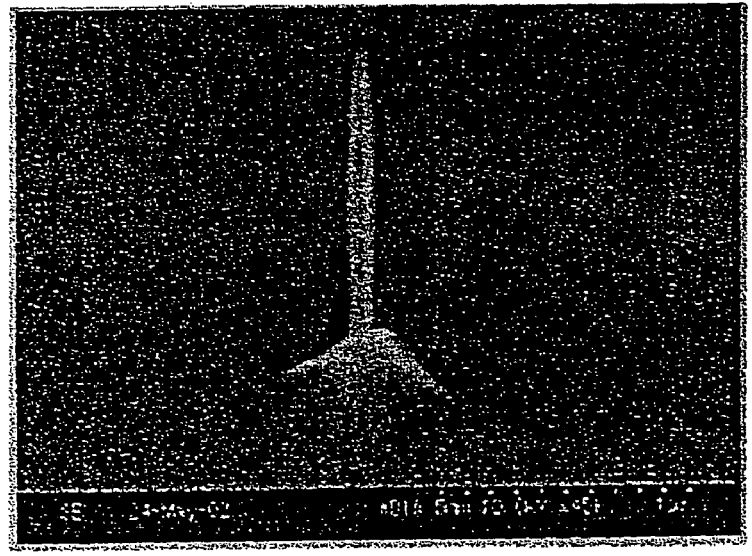
Figure 11A:
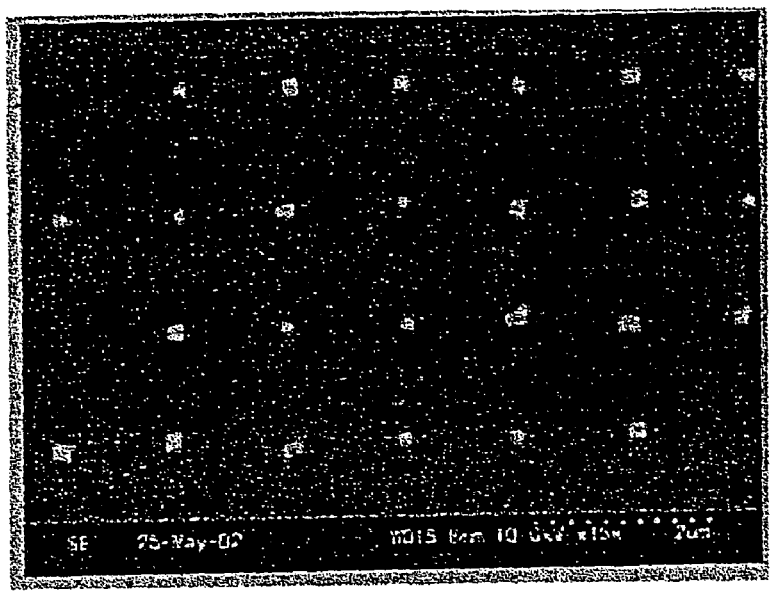
Figure 11B:
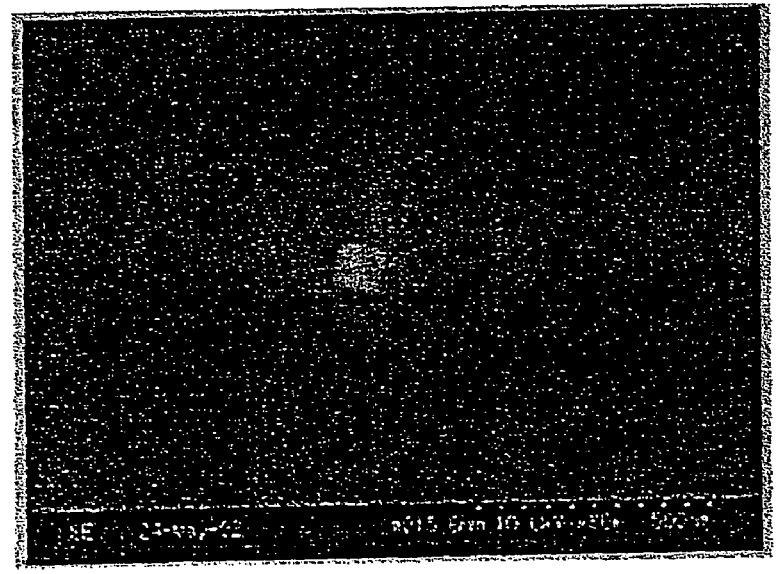
Figure 12:
Figure 13A:
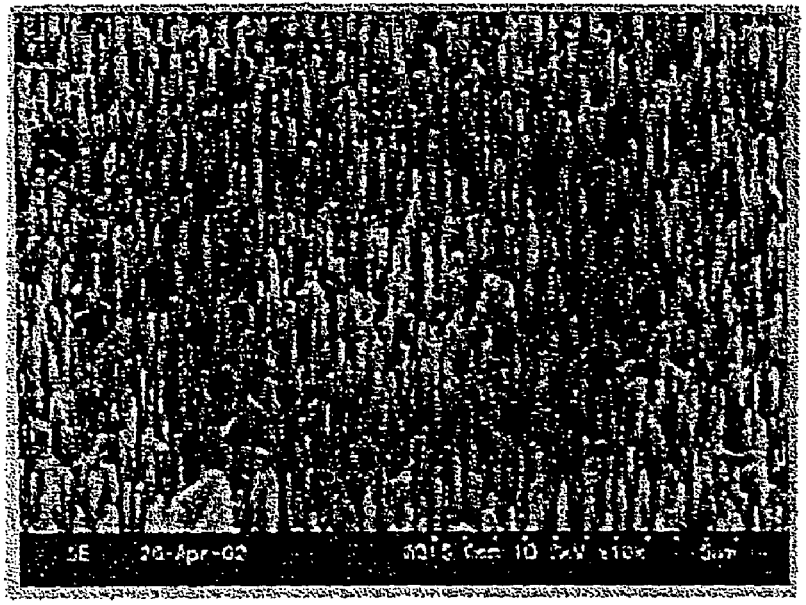
Figure 13B:
Figure 14:
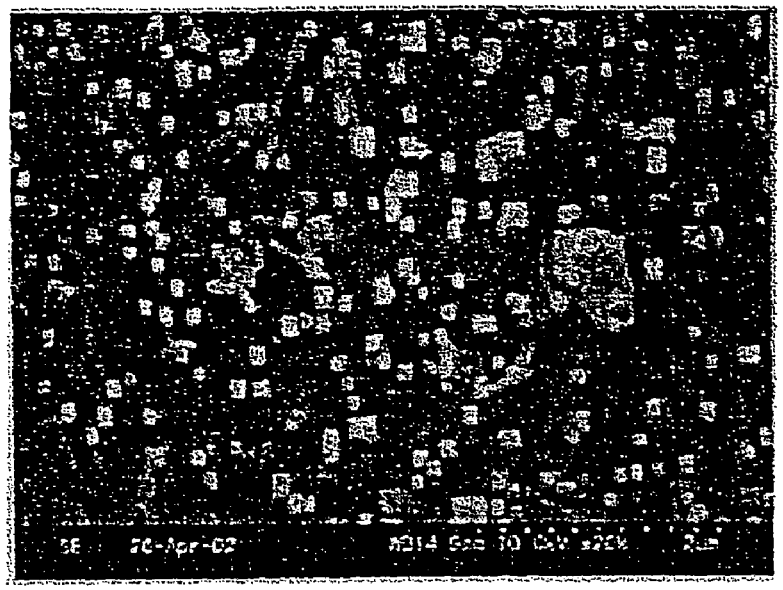
Figure 15:
Figure 16:
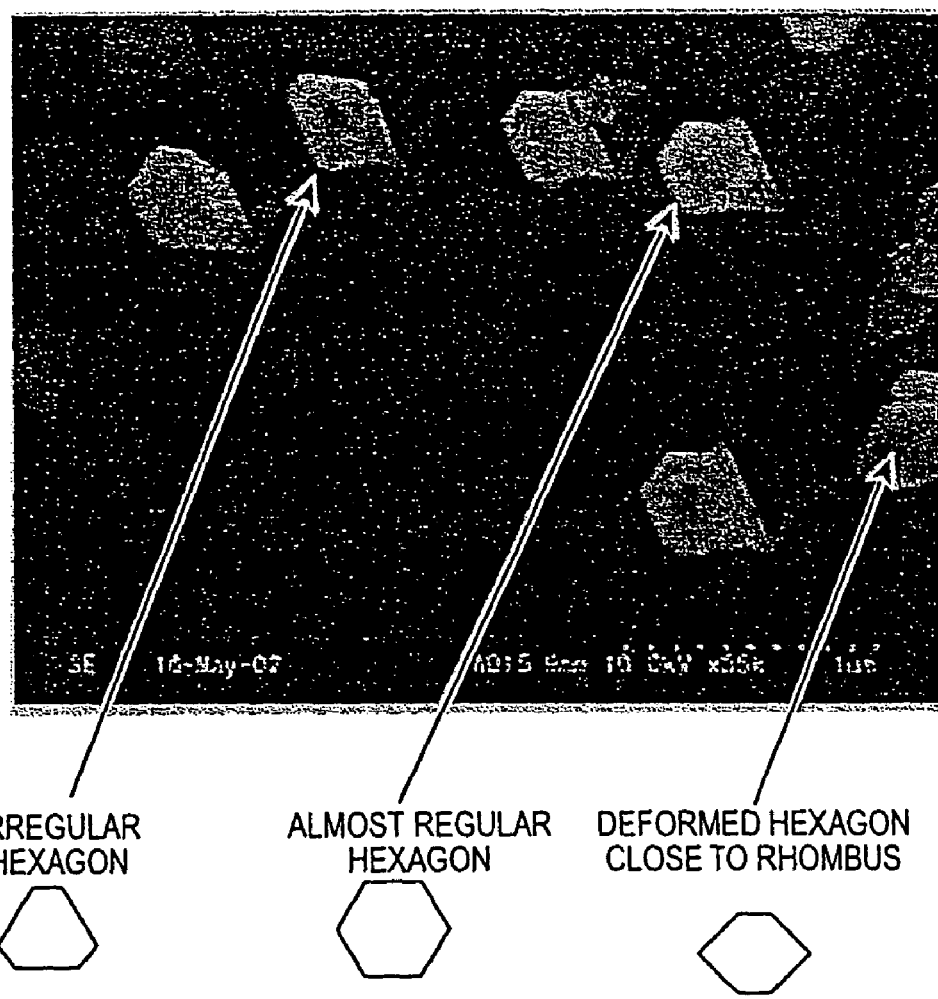
Figure 17:
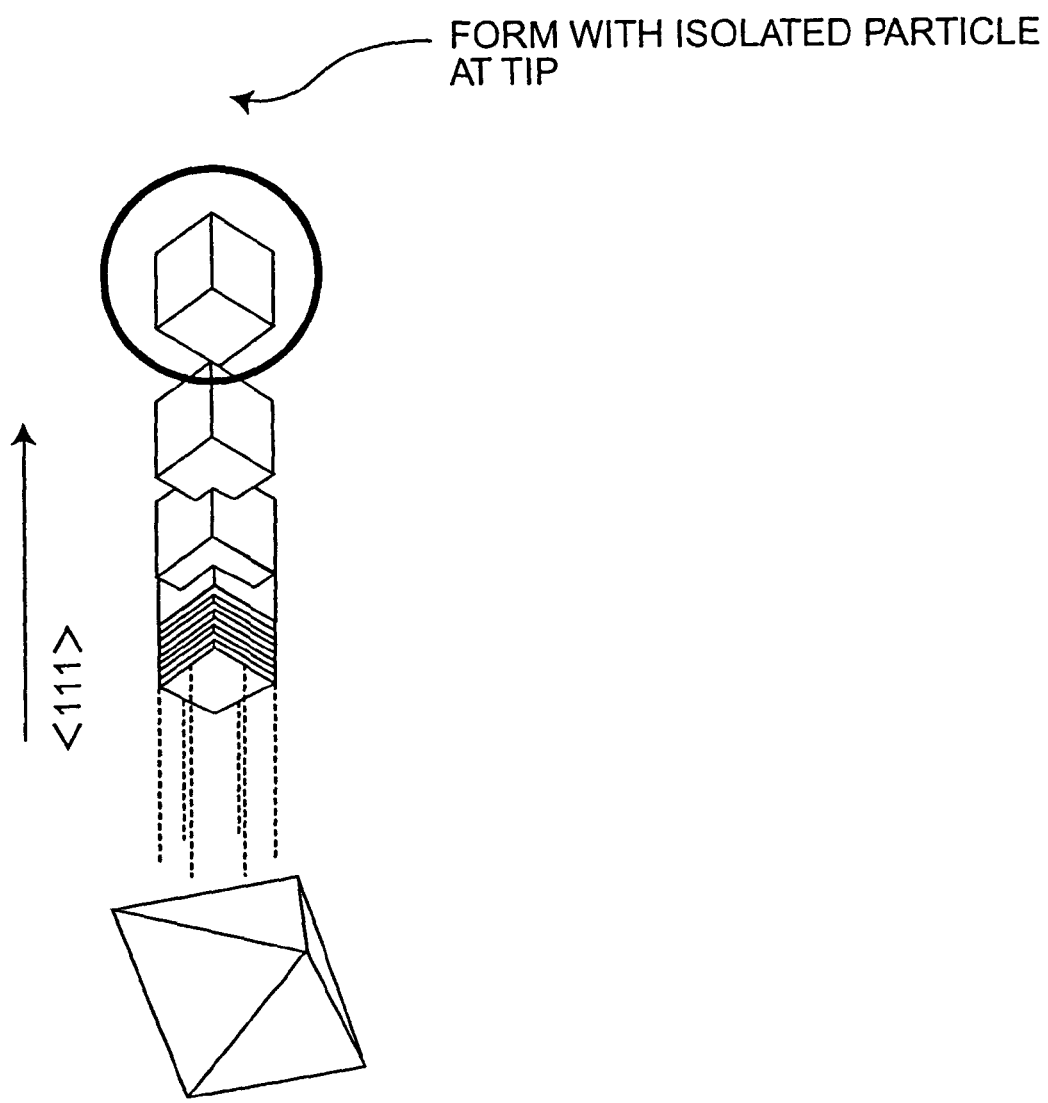
Figure 18:
Figure 19:
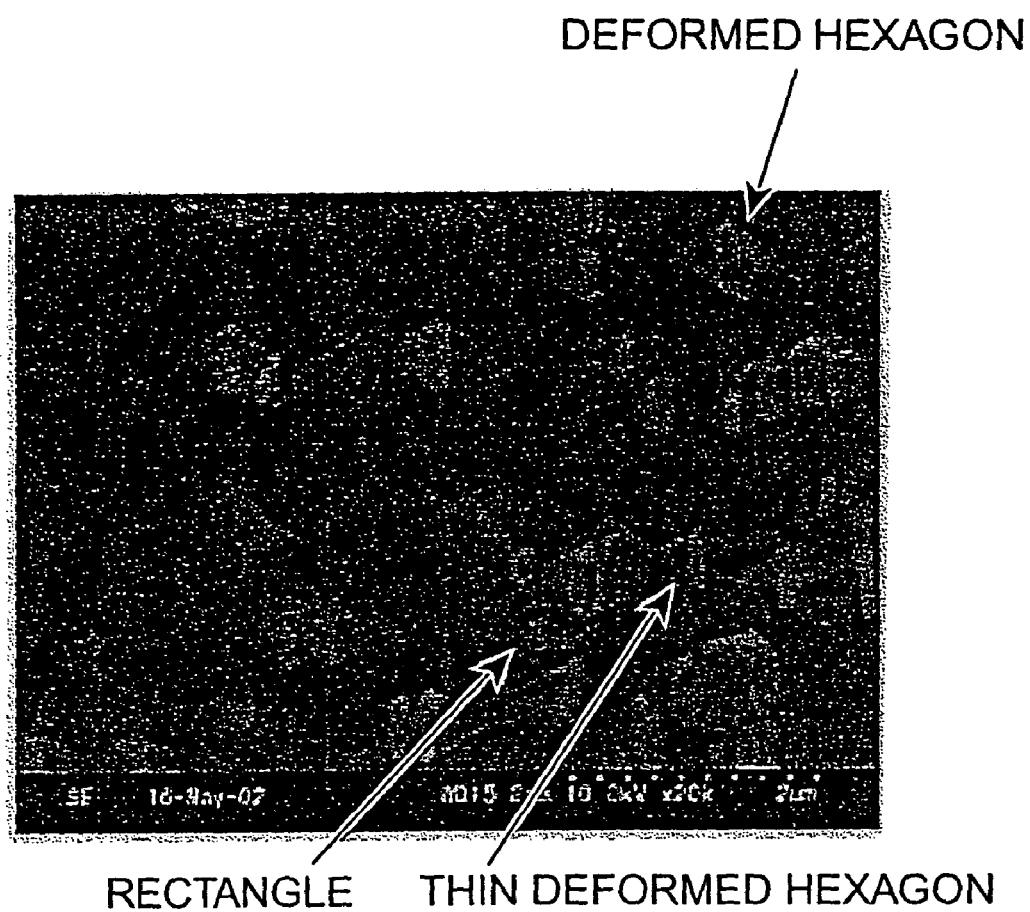
Figure 20:
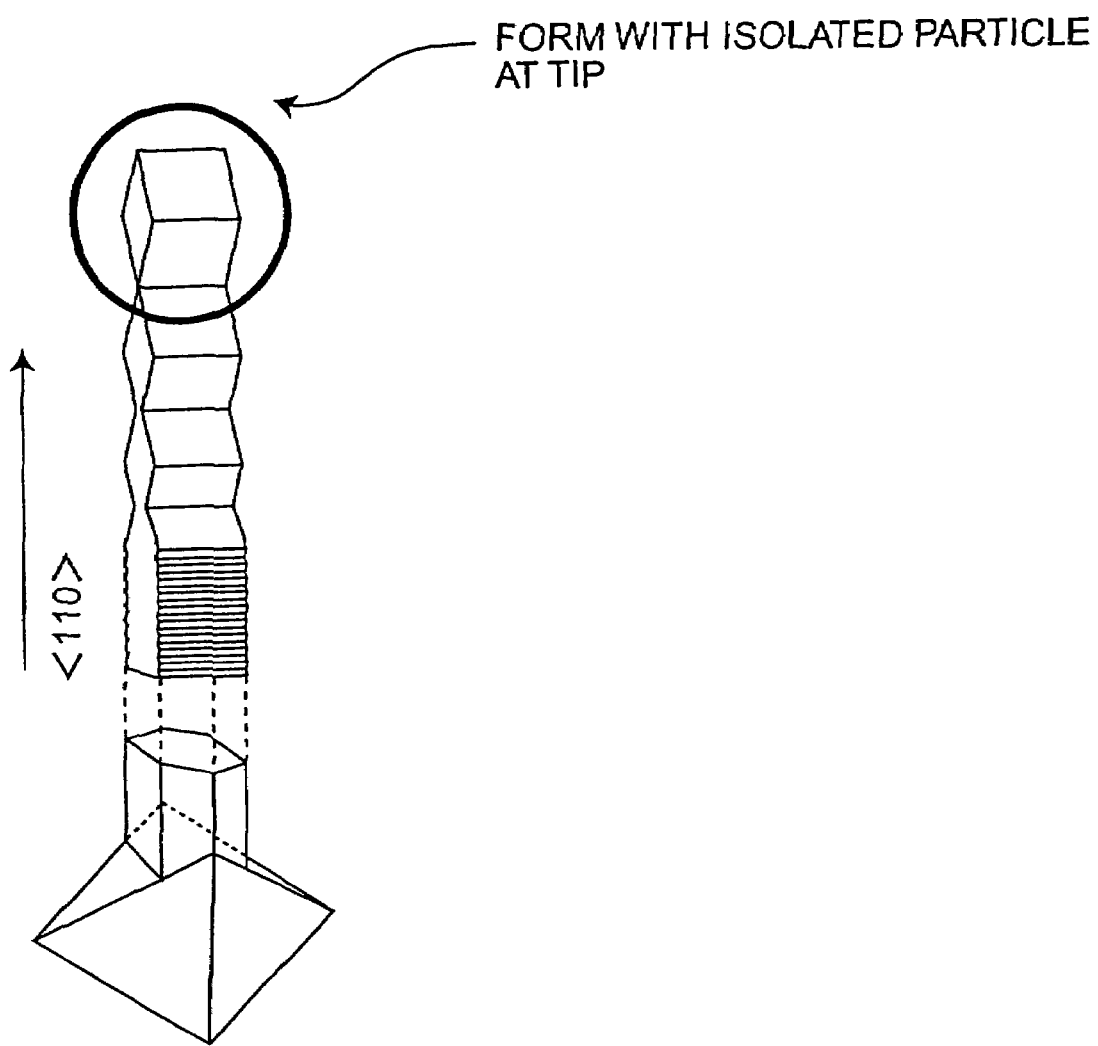

Each of FIGS. 4A–4C shows another embodiment of the microfabricated diamond element with an isolated particle;

FIGS. 5A and 5B show the shape of end face 12f of quadrangular column 12;

FIG. 6 shows the shape of end face 22f of hexagonal column 22;

FIGS. 7A–7C show the shape of end face 32f of circular column 32;

FIG. 8 is a vertical sectional view of transistor 8 to which diamond element 1 is applied;

FIG. 9 shows the projections formed using circular Al masks;

FIG. 10A shows the quadrangular columns in Example 2, and FIG. 10B is a partly enlarged view thereof;

FIG. 11A shows the end faces of the quadrangular columns in Example 2, and FIG. 11B is a partly enlarged view thereof;

FIG. 12 shows the projections formed using micromasks;

FIG. 13A shows the quadrangular columns in Example 3, and FIG. 13B is a partly enlarged view thereof;

FIG. 14 shows the end faces of the quadrangular columns in Example 3;

FIG. 15 shows the hexagonal columns in Example 4;

FIG. 16 shows the end faces of the hexagonal columns in Example 4;

FIG. 17 is a diagram for explaining the crystal structure in the form with an isolated particle at the tip;

FIG. 18 shows the quadrangular columns or hexagonal columns in Example 5;

FIG. 19 shows the end faces of the quadrangular columns or hexagonal columns in Example 5; and FIG. 20 is a diagram for explaining the crystal structure in the form with an isolated particle at the tip.

DESCRIPTION OF THE PREFERRED EMBODIMENTS

The preferred embodiments of the present invention will be described below in detail with reference to the accompanying drawings.

First Embodiment

Figure 1:
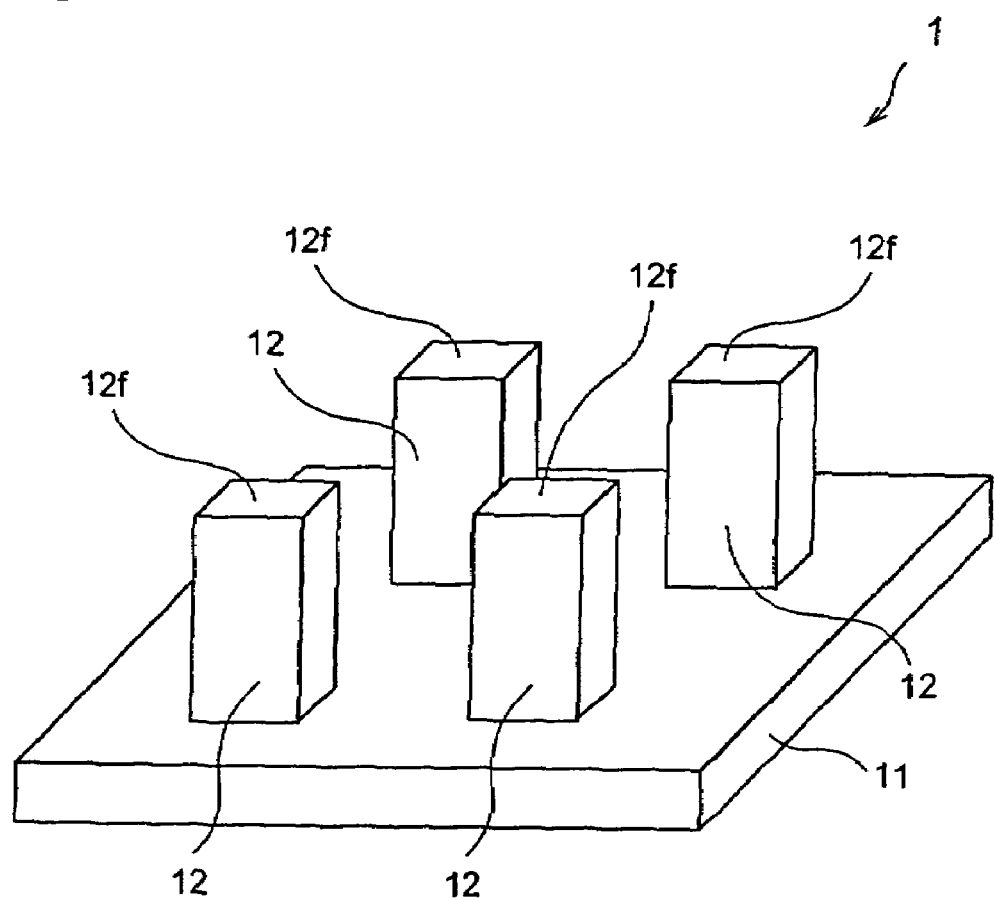
FIG. 1 is a schematic diagram showing a simplified form of diamond element 1.

First, the structure of the microfabricated diamond element (diamond element 1) in the first embodiment will be described. FIG. 1 is a schematic diagram showing a simplified form of diamond element 1. The diamond element 1 is comprised of a substrate 11, and a plurality of quadrangular columns 12 (microscopic projections) arranged at equal intervals on the substrate 11, made of diamond, and having side faces of flat faces. The diamond making the quadrangular columns 12 demonstrates luminescence characteristics against excitation means such as electron beam irradiation, X-ray irradiation, photoexcitation, current injection, heating, or the like and has a broad or sharp overall spectrum of generated light, which has a particularly high luminous intensity at a certain wavelength. In this specification, this wavelength is referred to as an "emission peak wavelength λ [nm]".

It is also conceivable to design the sectional shape of the columnar bodies (quadrangular columns 12) in agreement with another wavelength component instead of the emission peak wavelength, and to extract light of any desired wavelength component, though the luminous efficiency decreases in this case.

The diamond making the quadrangular columns 12 is preferably heteroepitaxial diamond, or a highly-oriented diamond film (in which plane directions are preferably aligned within 5°). There are no restrictions on the material of the substrate 11. In the case of a highly-oriented diamond film substrate, it is necessary to set the size of particles to approximately double the size (width) of the projections. This prevents electric supply from being hindered by influence of grain boundaries.

A thin film 13 of $SiO_2$ (not shown in FIG. 1) is formed on one side face of each quadrangular column 12. The quadrangular columns 12 are surrounded with a substance with a lower refractive index than those of diamond and $SiO_2$. There are no restrictions on the state of this low-index substance, and the low-index substance may be a gas or any other solid material. In a preferred example, air pervades the space around the quadrangular columns 12. The space around the quadrangular columns 12 may be kept in vacuum.

FIG. 5A shows the shape of end face 12f of quadrangular column 12. As shown in FIG. 5A, the end face 12f is of a quadrangular shape having the length of long sides being a [nm] and the length of short sides being ka [nm], and $SiO_2$ film 13 is formed on a side face on the short-edge side. In this regard, it is noted that the length a [nm] of the long sides and the length ka [nm] of the short sides satisfy the relational expressions represented by Formulae (1) and (2) below.

$$C_1 = 2a\sqrt{1+k^2} \quad (1)$$

$$n\lambda \approx C_1 \quad (2)$$

$C_1$: a distance [nm] of a lap in a situation where light generated inside the quadrangular column 12 goes around on a specific circuit while being reflected on the side faces of the quadrangular column 12, and n: an arbitrary positive integer.

The width $w_1$ of quadrangular column 12 (defined as a length of a diagonal, as expressed by Formula (7) below) is adjusted so as to be not more than half of the height of quadrangular column 12 (i.e., so that the aspect ratio is not less than 2) and be not more than 500 nm.

$$w_1 = a\sqrt{1+k^2} \quad (7)$$

The area of end face 12f is adjusted to be not more than 1/10 of the overall exposed area of quadrangular column 12.

The operation and effect of diamond element 1 will be described below. Since the lifetime of carriers (electron or holes) is relatively long in diamond having the indirect transition type band structure, electron-hole pairs become easier to recombine to emit light in the case where the quadrangular columns 12 are of the vertically long shape with narrow width to confine carriers (electrons or holes) in the narrow diamond crystal structure.

Since the quadrangular column 12 is surrounded with the low-index substance, part of light generated inside quadrangular column 12 is repeatedly reflected on the side faces of quadrangular column 12. FIG. 5A shows paths of light arriving at a small angle of incidence on a side face and traveling while being reflected on the side faces. The distance of a lap around such traveling paths is equal to the right side of above Formula (1), i.e., twice the length of the diagonal of end face 12f. Therefore, when the length a [nm] of the long sides and the length ka [nm] of the short sides of the end face 12f are adjusted to satisfy the relational expression of above Formula (1), the light (light traveling normally to the longitudinal direction of the columnar body or light including a small traveling component in the longitudinal direction of the columnar body) becomes a standing wave in the traveling paths. For this reason, the light resonates inside the quadrangular column 12, and the light is extracted to the outside without being attenuated. The light generated inside the quadrangular column 12 leaks little by little from the side faces or end face 12f of quadrangular column 12. In the present embodiment, because the $SiO_2$ film 13 (refractive index: 1.5) with the refractive index smaller than that of diamond (refractive index: 2.5) is formed on one side face, the light is likely to emerge through the $SiO_2$ film 13 to the outside.

The shape of the end face 12f may be square (k=1). FIG. 5B shows paths of light traveling while being reflected on the side faces in the case where the end face 12f is square.

Since the side faces of quadrangular column 12 are flat faces, the light is regularly reflected on the side faces. For this reason, the light generated inside the quadrangular column 12 is likely to become a standing wave.

For extracting the light including a small traveling component in the longitudinal direction of the columnar body, from the top surface of the columnar body, the top surface of the columnar body is preferably not a flat surface but a projecting shape. In this case, the light can be extracted from the top part, and thus there is no need for forming the material with the refractive index smaller than that of diamond on the side face.

The exciting means for luminescence may be cathodeluminescence of electron beam irradiation or excitation with X-rays. It may also be excitation by electric injection into a pn junction or a pin junction.

The diamond element 1 with the quadrangular columns 12 being formed on the substrate 11 can also be applied to transistors. FIG. 8 is a vertical sectional view of transistor 8 to which the diamond element 1 is applied. First insulating film 86, gate metal film 84, and second insulating film 86 are successively stacked on the substrate 11 so as to fill the space among the quadrangular columns 12. The gate metal film 84 is electrically connected to the quadrangular columns 12. An electrode metal film 82 is formed on the second insulating film 86 so as to be electrically connected to the quadrangular columns 12. The diamond making the substrate 11 and quadrangular columns 12 contains boron and is thus electrically conductive.

There is a Schottky barrier between the gate metal film 84 and the quadrangular columns 12, so that electrons flow from the gate metal film 84 with a higher Fermi level into the quadrangular columns 12 to form a depletion layer in the quadrangular columns 12. The thickness of the depletion layer is increased or decreased by applying a positive or negative voltage to the gate metal film 84, to control the intensity of electric current flowing from the substrate 11 to the electrode metal film 82.

The control of the electric current becomes easier as the width of quadrangular columns 12 decreases. A higher electric current can flow with increase in the number of quadrangular columns 12.

In the diamond element 1 of the present embodiment, since the side faces of quadrangular columns 12 are flat, good electrical connections are established with the gate metal film 84. For this reason, the control becomes easier over the thickness of the depletion layer.

Second Embodiment

Figure 2:
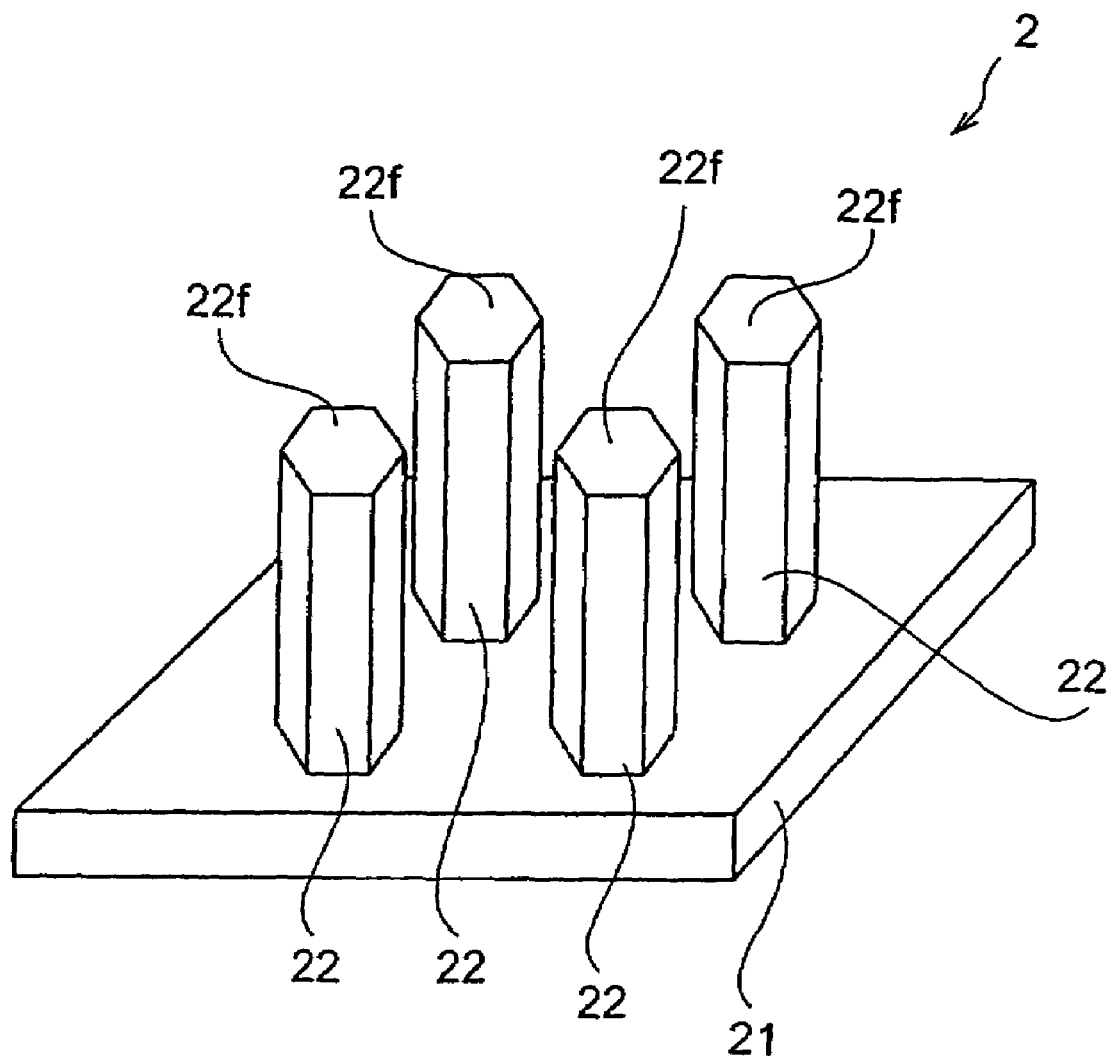
FIG. 2 is a schematic diagram showing a simplified form of diamond element 2.

First, the structure of the microfabricated diamond element (diamond element 2) in the second embodiment will be described. FIG. 2 is a schematic diagram showing a simplified form of diamond element 2. The diamond element 2 is comprised of a substrate 21, and a plurality of hexagonal columns 22 (microscopic projections) arranged at equal intervals on the substrate 21, made of diamond, and having side faces of flat faces. The diamond making the hexagonal columns 22 demonstrates luminescence characteristics against excitation means such as electron beam irradiation, X-ray irradiation, photoexcitation, current injection, heating, or the like and has a broad or sharp overall spectrum of generated light, which has a particularly high luminous intensity at a certain wavelength (emission peak wavelength λ [nm]).

It is also conceivable to design the sectional shape of the columnar bodies (hexagonal columns 22) in agreement with another wavelength component instead of the emission peak wavelength, and to extract light of any desired wavelength component, though the luminous efficiency decreases in this case.

A thin film 23 of $SiO_2$ (not shown in FIG. 2) is formed on one side face of each hexagonal column 22. The hexagonal columns 22 are surrounded with a substance with a lower refractive index than those of diamond and $SiO_2$.

FIG. 6 shows the shape of end face 22f of hexagonal column 22. As shown in FIG. 6, the end face 22f is of a hexagonal shape having the length of each side being b [nm], and $SiO_2$ film 23 is formed on one side face. The length b [nm] of each side satisfies the relational expressions of Formulae (3) and (4) below.

$$C_2 3\sqrt{3}b \qquad (3)$$

$$n\lambda \approx C_2 \qquad (4)$$

$C_2$: a distance [nm] of a lap in a situation where light generated inside the hexagonal column 22 goes around on a specific circuit while being reflected on the side faces of the hexagonal column 22, and n: an arbitrary positive integer.

The width $w_2$ of hexagonal column 22 (defined as a length of a longest diagonal, as expressed by Formula (8) below) is adjusted so as to be not more than half of the height of hexagonal column 22 (i.e., so that the aspect ratio is not less than 2) and be not more than 500 nm.

$$w_2 = 2b \qquad (8)$$

The area of end face 22f is adjusted to be not more than 1/10 of the overall exposed area of hexagonal column 22.

The operation and effect of diamond element 2 will be described below. Since the hexagonal columns 22 are surrounded with the low-index substance, part of light generated inside each hexagonal column 22 is repeatedly reflected on the side faces of the hexagonal column 22. FIG. 6 shows paths of light arriving at a small angle of incidence on a side face and traveling while being reflected on the side faces. The distance of a lap around the traveling paths is equal to the right side of above Formula (3). Therefore, when the length b [nm] of each side of end face 22f is adjusted to satisfy the relational expression of above Formula (3), the light (light traveling normally to the longitudinal direction of the columnar body or light including a small traveling component in the longitudinal direction of the columnar body) becomes a standing wave in the traveling paths. For this reason, the light resonates inside the hexagonal column 22, and the light is extracted to the outside without being attenuated. The light generated inside the hexagonal column 22 leaks little by little from the side faces or end face 22f of hexagonal column 22. In the present embodiment where the $SiO_2$ film 23 (refractive index: 1.5) with the refractive index smaller than that of diamond (refractive index: 2.5) is formed on one side face, the light is likely to emerge through the $SiO_2$ film 23 to the outside. In the other respects the present embodiment is able to achieve the operation and effect similar to those in Embodiment 1.

Third Embodiment

Figure 3:
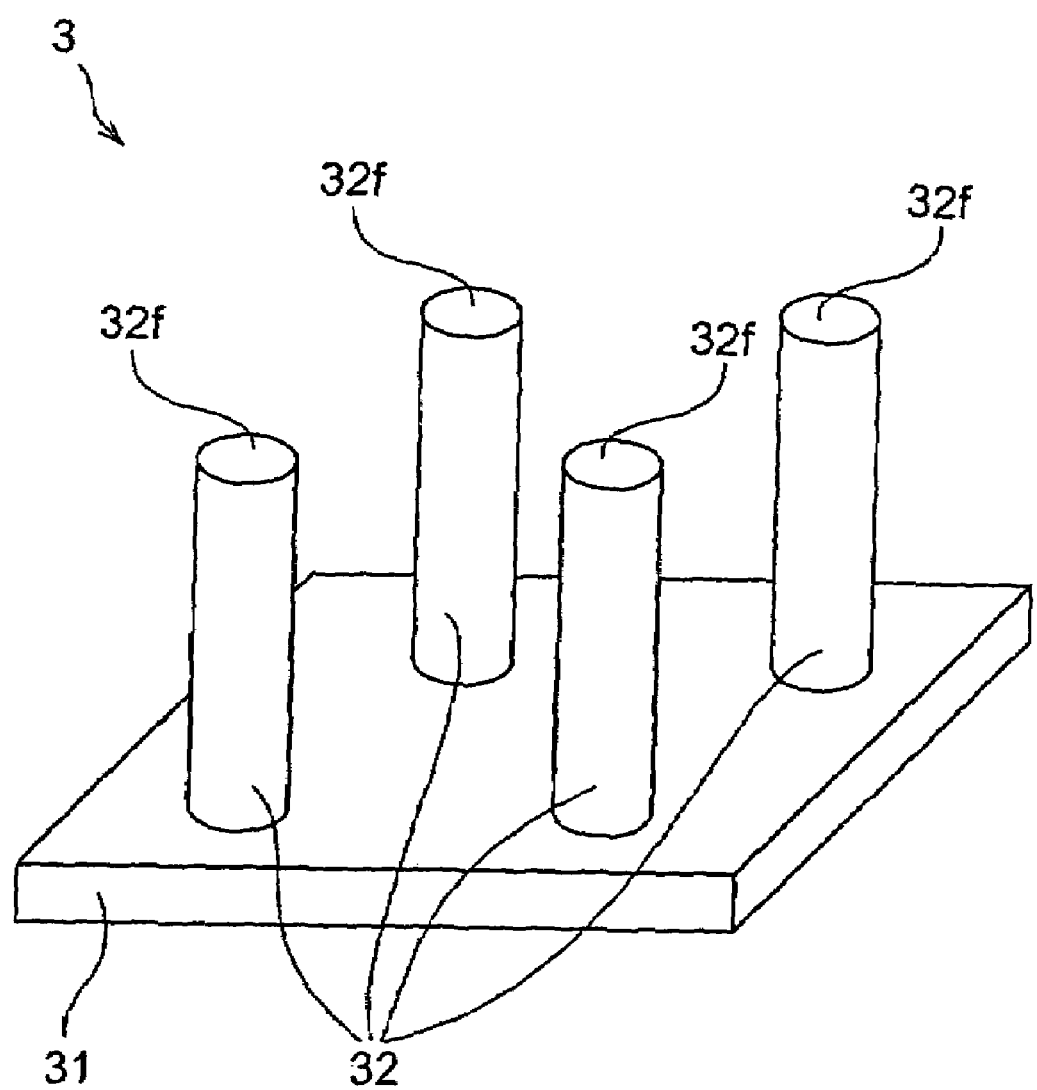
FIG. 3 is a schematic diagram showing a simplified form of diamond element 3.

First, the structure of the microfabricated diamond element (diamond element 3) in the third embodiment will be described. FIG. 3 is a schematic diagram showing a simplified form of diamond element 3. The diamond element 3 is comprised of a substrate 31, and a plurality of circular columns 32 (microscopic projections) arranged at equal intervals on the substrate 31 and made of diamond. The diamond making the circular columns 32 demonstrates luminescence characteristics against excitation means such as electron beam irradiation, X-ray irradiation, photoexcitation, current injection, heating, or the like and has a broad or sharp overall spectrum of generated light, which has a particularly high luminous intensity at a certain wavelength (emission peak wavelength $\lambda$ [nm]).

It is also conceivable to design the sectional shape of the columnar bodies (circular columns 32) in agreement with another wavelength component instead of the emission peak wavelength, and to extract light of any desired wavelength component, though the luminous efficiency decreases in this case.

FIG. 7 shows the shape of end face 32f of circular column 32. As shown in FIG. 7, the end face 32f is a circle with the radius being r [nm]. The radius r [nm] is adjusted so that approximately six times the radius r becomes equal to an integral multiple of the emission peak wavelength within the scope satisfying the relational expressions of Formulae (5) and (6) below.

$$3\sqrt{3}r < C_3 < 2\pi r \qquad (5)$$

$$n\lambda = C_3 \approx 6r \qquad (6)$$

$C_3$: a distance [nm] of a lap in a situation where light generated inside the circular column 32 goes around on a specific circuit while being reflected on the side face of the circular column 32, and n: an arbitrary positive integer.

The diameter of circular column 32 is adjusted so as to be not more than half of the height of circular column 32 (i.e., so that the aspect ratio is not less than 2) and be not more than 500 nm.

The area of end face 32f is adjusted to be not more than 1/10 of the overall exposed area of circular column 32.

The operation and effect of diamond element 3 will be described below. Since each circular column 32 is surrounded with the low-index substance, part of light generated inside the circular column 32 is repeatedly reflected on the side face of circular column 32. FIG. 7 shows paths of light traveling while being reflected on the side face. The distance of a lap around the traveling paths is within the range of 3 ($3^{1/3}$)r to 2 $\pi$r [nm]. Therefore, when the radius r [nm] of the end face 32f is adjusted so that approximately six times the radius r becomes equal to an integral multiple of the emission peak wavelength within the range satisfying the relational expression of Formula (5) above, the light (light traveling normally to the longitudinal direction of the columnar body or light including a small traveling component in the longitudinal direction of the columnar body) becomes a standing wave in the traveling paths. For this reason, the light resonates inside the circular column 32, and the light is extracted to the outside without being attenuated. In the other respects the present embodiment is able to achieve the operation and effect similar to those in Embodiment 1.

Diamond is the indirect transition type material, which forms excitons with a very strong bond and brings about exciton luminescence. It also demonstrates trace quantity of luminescence of free excitons without any phonon, and exciton luminescence with n phonons in the TO mode and in the LO mode. It also exhibits luminescence from droplets consisting of a lot of excitons.

Furthermore, if there exists boron or impurities, the excitons will be bound to cause luminescence of bound excitons. Such luminescence involves emission of light at different luminescence peaks, depending upon states of impurities and others in the material between 230 and 240 nm, and it is thus feasible to implement luminescence at various luminescence wavelengths. If a large amount of boron is included luminescence can occur at 250 nm. If there exist defects luminescence will occur in a broad band of about 300–400 nm at room temperature, or a broad band of luminescence called band A will appear near 420 nm. It is also feasible to implement luminescence at any wavelength in the range of 500 nm to 750 nm, such as H3 centers, NV centers, GR centers, etc. due to nitrogen or defects. As described above, it is feasible to realize the luminescence wavelengths ranging from 230 nm to visible light. Such luminescence can be combined with geometrically machined shapes.

FIG. 4 shows another embodiment of the microfabricated diamond element. The microfabricated diamond element of the present invention may be of a shape with an isolated particle of diamond being on the tip of a columnar body. In this case, the joint area is small between the isolated particle and the tip of the columnar body, so that the effect of confining carriers (electrons or holes) generated in the isolated particle becomes prominent.

In the above embodiments, the sectional shape of the columnar body is designed so as to induce resonance at the emission wavelength, but it may also be designed so as to induce resonance at the de Broglie wavelength of electrons or holes in diamond instead thereof. Namely, the sectional shape of the columnar body is designed so as to satisfy Formulae (9) and (10) below. In this case, the width or diameter of the cross section of the columnar body needs to be not more than 50 nm.

$$n\gamma \approx 2a \quad (9)$$

$$m\gamma \approx 2ka \quad (10)$$

n: an arbitrary positive integer,
m: an arbitrary positive integer,
γ: the de Broglie wavelength [nm] of electrons or holes in diamond,
a: the length of the long sides [nm], and
k: the ratio of the length of the short sides to the length of the long side.

Next, an embodiment of the method of fabricating the microfabricated transistor element will be described. First, prepared is a single-crystal diamond substrate, or a substrate of a material except for diamond (Si or the like) with a highly-oriented diamond film or a heteroepitaxial diamond film being formed thereon.

A film of a mask material such as Al, $SiO_2$, or the like is formed on the substrate and is patterned by photolithography technology. Etching is carried out using the patterned film as a mask, to form diamond projections with high aspect ratios.

Any desired shape (quadrangle, regular hexagon, circle, or the like) and arrangement of projections can be achieved by the mask patterning.

Thereafter, the projections are processed in a plasma of a gas mainly containing hydrogen, to reconstruct diamond crystals, whereby the side faces can be formed of diamond crystal faces. In this case, plane directions of diamond affect the shape of deformed projections. For example, in the case of a (100) substrate, the projections tend to be quadrangular columns in which (100) faces appear in the side faces and end face. In the case of a (110) substrate, the projections tend to be quadrangular columns or hexagonal columns in which (110) faces or (100) faces appear in the side faces. In the case of a (111) substrate, the projections tend to be hexagonal columns in which higher-index faces appear in the side faces.

When the projections are made of the highly-oriented diamond film, plane directions of side faces of the rectangular columns are not aligned even after the plasma process. In this case, the shape of the projections is made by only the etching process without the plasma process.

EXAMPLES

The present invention will be described below in further detail with Examples thereof, but it is noted that the present invention is by no means intended to be limited to these Examples.

Example 1

First, an Al film was formed on each (100) diamond substrate by sputtering or vapor deposition. The thickness of the Al film is approximately 500 Å-2 μm, and is determined according to the patterning size or the height of projections. Since the etching ratio of diamond to AL is 10 or more, the thickness of 0.5 μm was enough for the Al film in the case of the projections with the height of not more than 5 μm.

Microscopic patterns were formed in the thus formed Al film by photolithography technology. When the patterns are microscopic, the etching becomes easier with decrease in the thickness of the Al film. The patterns of the end faces of the projections may be quadrangular, but they were circular herein. Using such Al films as masks, the etching by RIE technology was carried out in a gas containing $CF_4$ 1–3% in oxygen. If the plasma gas contains only oxygen a number of aciculate portions will be formed at the tip of one projection; whereas, the addition of $CF_4$ 1–3% will optimize the number of aciculate portions to one.

The diamond substrates after the etching were subjected to the plasma process under the conditions presented in Table 4.

TABLE 4

| NO. | PLASMA GAS AND FLOW RATE | PRESSURE (Torr) | POWER (W) | SUBSTRATE TEMPERATURE (° C.) | PROCESS TIME |
|---|---|---|---|---|---|
| 1 | $H_2$:100 sccm | 25 | 1300 | 750 | APPROX. 30 MIN |
| 2 | $H_2$:300 sccm | 50 | 1300 | 750 | APPROX. 30 MIN |
| 3 | $H_2$:300 sccm | 100 | 1300 | 750 | APPROX. 38 MIN |
| 4 | $CO_2$:3 sccm + $H_2$:297 sccm | 100 | 1300 | 750 | APPROX. 10 MIN |
| 5 | $H_2$:100 sccm | 25 | 1000 | 900 | APPROX. 30 MIN |
| 6 | $H_2$:100 sccm | 25 | 1300 | 750 | APPROX. 30 MIN |
| 7 | $H_2$:100 sccm | 25 | 300 | 750 | APPROX. 30 MIN |

TABLE 4-continued

| NO. | PLASMA GAS AND FLOW RATE | PRESSURE (Torr) | POWER (W) | SUBSTRATE TEMPERATURE (° C.) | PROCESS TIME |
|---|---|---|---|---|---|
| 8 | $CO_2$:3 sccm + $H_2$:297 sccm | 25 | 1300 | 750 | APPROX. 10 MIN |
| 9 | $H_2$:100 sccm | 25 | 1300 | 750 | APPROX. 30 MIN |
| 10 | $H_2$:100 sccm | 25 | 1300 | 750 | APPROX. 30 MIN |
| 11 | $H_2$:100 sccm | 25 | 1300 | 750 | APPROX. 30 MIN |
| 12 | $H_2$:100 sccm | 25 | 1300 | 750 | APPROX. 15 MIN |
| 13 | $H_2$:100 sccm | 25 | 1300 | 750 | APPROX. 10 MIN |

As a result, the circular projections were shaped into quadrangular columns in all the samples. Although there were differences in the length of process time, depending upon the conditions, the shaping was basically implemented under any conditions to effect synthesis of diamond, provided that the methane concentration was very low and the gas was in a hydrogen excess condition or in an oxygen added condition. With increase in power or with increase in substrate temperature the process time became shorter and the shaping became more difficult. The shaping was infeasible under conditions that diamond was not formed under substances other than it were formed. Under the conditions of Nos. 1, 6, and 9–13 among the conditions presented in Table 4, the resultant side faces of the quadrangular columns became fairly flat. In particular, favorable conditions were the pressure condition in the range of 10–30 Torr and the substrate temperature in the range of 650–850° C. Among those, the best conditions in terms of controllability and fineness of shape were the conditions of the pressure condition of 25 Torr and the substrate temperature of 750° C.

Example 2

Circular Al masks arrayed at equal intervals were formed on a (100) diamond substrate by photolithography, and the substrate was subjected to RIE. As a result, aciculate projections with cylindrical bodies on the bottom side were formed in an arrayed state. FIG. 9 shows the projections formed with the use of the circular Al masks. The reason why the projections look aciculate is that the Al masks were very small and very deep etching was done in spite of the small masks. When the circular Al masks are large, cylinder-shaped projections are formed.

The aciculate projections were subjected to the plasma process under the following conditions: $H_2$ flow rate 100 sccm, pressure 25 Torr, power 1300 W, substrate temperature 750° C., and process time 10–15 minutes. As a consequence, the aciculate projections were shaped into quadrangular columns. This is because the plane direction of the substrate was (100). One side of horizontal section of a particularly thin projection was 50 nm. FIG. 10A shows the quadrangular columns in the present example, and FIG. 10B is a partly enlarged view thereof. As shown in FIGS. 10A and 10B, diamond was deposited with the spreading bottom at the root of each quadrangular column.

FIG. 11A shows end faces of the quadrangular columns in the present example, and FIG. 11B is a partly enlarged view thereof. As shown in FIG. 11A, many end faces are square, but some are rectangular. This is caused by variation in size and shape of the circular Al masks. If the patterning control of circular Al masks is precise about the size and shape, all the quadrangular columns can be made in substantially identical shape and size.

Example 3

A metal as a mask material was placed in contiguity with a (100) diamond substrate (within 5 cm) in a reaction chamber, and this diamond substrate was subjected to RIE. Broken pieces of the mask material attached onto the diamond substrate and functioned as micromasks. As a result, aciculate projections were formed in random arrangement. FIG. 12 shows the projections formed by the use of the micromasks. Since the size of the micromasks formed by the method of the present example was very small, the projections were thinner than those in the case of Example 2 and were thus arranged in a fine array. One side of horizontal section of a particularly thin projection was not more than 10 nm.

The aciculate projections were subjected to the plasma process under the same conditions as in Example 2. As a result, the aciculate projections were shaped into quadrangular columns. This is because the plane direction of the substrate was (100). One side of horizontal section of a particularly thin projection after having undergone plasma process was 50 nm. FIG. 13A shows the quadrangular columns in the present example and FIG. 13B is a partly enlarged view thereof. FIG. 14 shows the end faces of the quadrangular columns in the present example.

Example 4

A (111) diamond substrate was subjected to the same etching and plasma process (where the process time was about 30 minutes) as in Example 2. As a result, hexagonal columns were formed. FIG. 15 shows the hexagonal columns in the present example. FIG. 16 shows the end faces of the hexagonal columns in the present example. As shown in FIG. 16, some end faces deviated from the regular hexagon, while some other end faces were of the regular hexagon. The side faces were not low-index faces, but were fairly flat faces better than those formed by etching.

Also observed were projections which had a small area of a joint part between the tip and a main body supporting it, i.e. columnar bodies with isolated particles thereon. FIG. 17 is a diagram for explaining the crystal structure of the form with the isolated particle at the tip. As shown in FIG. 17, the isolated particle is formed when the (100) face appears only at the tip part. By making use of it, the form with the isolated particle at the tip can be fabricated.

Example 5

A (110) diamond substrate was subjected to the same etching and plasma process (where the process time was about 30 minutes) as in Example 2. As a result, quadrangular columns or hexagonal columns were formed. FIG. 18 shows the quadrangular columns or hexagonal columns in the present example. FIG. 19 shows the end faces of the quadrangular columns or hexagonal columns in the present example. As shown in FIG. 19; some end faces deviated from the regular hexagon, while some end faces were of the regular hexagon. The columns can be made in uniform shape of the rectangular hexagon by controlling the size and shape of Al masks so as to be constant. Two of the side faces were (100) faces. The other faces were (100) faces or other crystal faces that are not always low-index faces, but they were fairly flat faces better than the faces formed by etching.

Also observed were projections which had a small area of a joint part between the tip and a main body supporting it, i.e. columnar bodies with isolated particles thereon. FIG. 20 is a diagram for explaining the crystal structure of the form with the isolated particle at the tip. As shown in FIG. 20, the isolated particle is formed when the (100) face appears only at the tip part. By making use of it, the form with the isolated particle at the tip can be fabricated.

Example 6

The microfabricated diamond element with the columnar bodies of cylindrical shape was formed by the etching process similar to that in Example 2. Sample 1 was made using a diamond substrate in which the content of boron, nitrogen, etc. was adjusted so as to achieve the emission peak wavelength of 500 nm. Sample 2 was made using a diamond substrate in which the content of boron, nitrogen, etc. was adjusted so as to achieve the emission peak wavelength of 400 nm.

Experiment Result 1

The cathode luminescence (a spectral component at the wavelength of 500 nm) was observed for the microfabricated diamond element of Sample 1, and the result was that the substrate demonstrated strong luminous intensity and the columnar bodies did stronger luminous intensity.

Experiment Result 2

The cathode luminescence (a spectral component at the wavelength of 400 nm) was observed for the microfabricated diamond element of Sample 1, and the result was that neither the substrate nor the columnar bodies glowed.

Experiment Result 3

The cathode luminescence (a spectral component at the wavelength of 500 nm) was observed for the microfabricated diamond element of Sample 2, and the result was that the substrate was dark but the columnar bodies glowed at strong luminous intensity.

Experiment Result 4

The cathode luminescence (a spectral component at the wavelength of 400 nm) was observed for the microfabricated diamond element of Sample 2, and the result was that the substrate glowed at strong luminous intensity and the columnar bodies were dark conversely.

It is understood from the above experiment results that the columnar bodies of the present embodiment efficiently emit the light at the wavelength of 500 nm but attenuate the light at the wavelength of 400 nm. This verifies the principle of the present invention that the luminous efficiency is increased by adjusting the shape of the columnar bodies so as to induce resonance of the light at the emission peak wavelength of the material of diamond, in other word by adjusting the diamond so as to match the resonance wavelength of the columnar bodies with the emission peak wavelength.

It is also seen from the results of Experiment Results 1 and 3 that when the resonance wavelength of the columnar bodies agrees with the emission peak wavelength, the luminous efficiency in the columnar bodies is increased by the effect of confining carriers (electrons or holes).

What is claimed is:

1. A microfabricated diamond element wherein at least one columnar body of a quadrangular cross section comprising diamond is formed on a substrate, and wherein lengths of a long side and a short side in the cross section of the columnar body satisfy relational expressions represented by Formulae (1) and (2) below;

$$C_1 = 2a\sqrt{1+k^2} \quad (1)$$

$$n\lambda \approx C_1 \quad (2)$$

$C_1$: a distance [nm] of a lap in a situation where light generated inside the columnar body goes around on a specific circuit while being reflected on side faces of the columnar body, n: an arbitrary positive integer, $\lambda$: an emission peak wavelength [nm] of the diamond, a: the length of the long side [nm], and k: a ratio of the length of the short side to the length of the long side.

2. The microfabricated diamond element according to claim 1, wherein each side face of the columnar body is a flat surface consisting of a diamond crystal face.

3. The microfabricated diamond element according to claim 2, wherein the diamond crystal face is a (100) face.

4. The microfabricated diamond element according to claim 1, wherein a width $w_1$ of the columnar body is expressed by Formula (7) below;

$$w_1 = a\sqrt{1+k^2}, \quad (7)$$

and wherein the width $w_1$ is not more than 500 nm.

5. The microfabricated diamond element according to claim 1, wherein a width $w_1$ of the columnar body is expressed by Formula (7) below;

$$w_1 = a\sqrt{1+k^2}, \quad (7)$$

and wherein a ratio of a height to the width $w_1$ of the columnar body is not less than 2.

6. The microfabricated diamond element according to claim 1, wherein a ratio of a sectional area of the cross section normal to the longitudinal direction of the columnar body to an overall exposed area of the columnar body is not more than 1/10.

7. The microfabricated diamond element according to claim 1, wherein the columnar bodies are arranged at equal intervals.

8. The microfabricated diamond element according to claim 1, wherein an optically transparent film with a refractive index smaller than that of the diamond is formed in part of the side face of the columnar body.

9. A microfabricated diamond element wherein at least one columnar body of a substantially regularly hexagonal cross section comprising diamond is formed on a substrate, and wherein lengths of sides in the cross section of the columnar body satisfy relational expressions represented by Formulae (3) and (4) below;

$$C_2 = 3\sqrt{3}b \qquad (3)$$

$$n\lambda \approx C_2 \qquad (4)$$

$C_2$: a distance [nm] of a lap in a situation where light generated inside the columnar body goes around on a specific circuit while being reflected on side faces of the columnar body, n: an arbitrary positive integer, λ: an emission peak wavelength [nm] of the diamond, and b: the length of the sides [nm].

10. The microfabricated diamond element according to claim 9, wherein a width $w_2$ of the columnar body is expressed by Formula (8) below;

$$w_2 = 2b, \qquad (8)$$

and wherein the width $w_2$ is not more than 500 nm.

11. The microfabricated diamond element according to claim 9, wherein a width $w_2$ of the columnar body is expressed by Formula (8) below;

$$w_2 = 2b, \qquad (8)$$

and wherein a ratio of a height to the width $w_2$ of the columnar body is not less than 2.

12. A microfabricated diamond element wherein at least one columnar body of a circular cross section comprising diamond is formed on a substrate, and wherein when a length of a radius in the cross section of the columnar body is r [nm], and a specific circuit, on which light generated inside the columnar body goes around while being reflected on a side face of the columnar body, is represented by a regular polygon in which a distance from a center to corners thereof is r [nm], the perimeter $C_3$ [m] of the regular polygon satisfies relational expressions represented by Formulae (5) and (6) below:

$$3\sqrt{3}r < C_3 < 2\pi r \qquad (5)$$

$$n\lambda \approx C_3 \qquad (6)$$

n: an arbitrary positive integer, and

λ: an emission peak wavelength [nm] of the diamond.

13. The microfabricated diamond element according to claim 12, wherein a diameter of the columnar body is not more than 500 nm.

14. The microfabricated diamond element according to claim 12, wherein a ratio of a height of the columnar body to a diameter of the columnar body is not less than 2.

15. A microfabricated diamond element wherein at least one columnar body of a quadrangular cross section comprising diamond and having a maximum diameter of not more than 50 nm is formed on a substrate, and wherein lengths of a long side and a short side in the cross section of the columnar body satisfy relational expressions represented by Formulae (9) and (10) below;

$$n\gamma \approx 2a \qquad (9)$$

$$m\gamma \approx 2ka \qquad (10)$$

n: an arbitrary positive integer, m: an arbitrary positive integer,

γ: the de Broglie wavelength [nm] of electrons or holes in the diamond, a: the length of the long side [nm], and k: a ratio of the length of the short side to the length of the long side.

\* \* \* \* \*